US012623540B2

(12) United States Patent　　　　(10) Patent No.:　　US 12,623,540 B2

Nellen et al.　　　　　　　　　　　　(45) Date of Patent:　　　May 12, 2026

(54) VEHICLE AND A DISPLAY DEVICE FOR USE THEREIN

(71) Applicant: Inalfa Roof Systems Group B.V., Oostrum (NL)

(72) Inventors: Marcel Johan Christiaan Nellen, Merselo (NL); Viktor Pfeifer, Moers (DE)

(73) Assignee: INALFA ROOF SYSTEMS GROUP B.V., Oostrum (NL)

( * ) Notice: Subject to any disclaimer, the term of this patent is extended or adjusted under 35 U.S.C. 154(b) by 167 days.

(21) Appl. No.: 18/534,533

(22) Filed: Dec. 8, 2023

(65) Prior Publication Data

US 2024/0190250 A1　　　Jun. 13, 2024

(30) Foreign Application Priority Data

Dec. 12, 2022　　(EP) ..................................... 22212881

(51) Int. Cl.
| | |
|---|---|
| B60K 35/53 | (2024.01) |
| B60K 35/60 | (2024.01) |
| H05K 5/02 | (2006.01) |

(52) U.S. Cl.
CPC ............. B60K 35/53 (2024.01); B60K 35/60 (2024.01); H05K 5/0217 (2013.01); *B60K 2360/771* (2024.01)

(58) Field of Classification Search
CPC .. B60K 35/53; B60K 35/60; B60K 2360/771; H05K 5/0217
USPC ........................................................ 348/837
See application file for complete search history.

(56) References Cited

U.S. PATENT DOCUMENTS

| | | | |
|---|---|---|---|
| 11,358,450 | B2 | 6/2022 | Eger |
| 11,511,681 | B2 | 11/2022 | Bruegl et al. |
| 11,577,662 | B2 | 2/2023 | Podolski |
| 11,673,513 | B2 | 6/2023 | Bruegl et al. |
| 2015/0138043 | A1 | 5/2015 | Rawlinson et al. |
| 2017/0158034 | A1 | 6/2017 | Nellen et al. |

(Continued)

FOREIGN PATENT DOCUMENTS

| | | |
|---|---|---|
| CN | 108773329 A | 11/2018 |
| DE | 102018129479 A1 | 5/2020 |

(Continued)

OTHER PUBLICATIONS

Search Report in corresponding European Patent Application No. 22212881.1 dated Jun. 6, 2023.

*Primary Examiner* — Joseph G Ustaris
(74) *Attorney, Agent, or Firm* — Steven M. Koehler; Westman, Champlin & Kochler, P.A.

(57) ABSTRACT

A display device for attachment to a vehicle roof, comprises a display screen and an operating mechanism to move the screen into a storage position and an operational position. The operating mechanism includes at least one guide rail mounted to the roof and a first and second slide shoe slidably guided in the guide rail. A screen support supports the screen and is pivotally connected to the first or second slide shoe. A lever is pivotally connected to the screen support and to the other of the first and second slide shoes to at least rotate the screen between its operational and storage positions by changing the distance between the first and second slide shoes. Only the first slide shoe is driven by a drive motor. The second slide shoe has a locking mechanism to lock the second slide shoe where the screen is moved toward its operational position.

20 Claims, 7 Drawing Sheets

(56) References Cited

U.S. PATENT DOCUMENTS

| | | |
|---|---|---|
| 2020/0070736 A1 | 3/2020 | Kim |
| 2020/0290442 A1 | 9/2020 | Eger |
| 2021/0070233 A1 | 3/2021 | Podolski |
| 2021/0162931 A1 | 6/2021 | Bruegl et al. |
| 2021/0197731 A1 | 7/2021 | Vervoort et al. |

FOREIGN PATENT DOCUMENTS

| | | |
|---|---|---|
| DE | 10201912408 B3 | 2/2021 |
| EP | 2873563 A1 | 5/2015 |
| EP | 3683097 A1 | 7/2020 |
| EP | 3845420 A1 | 7/2021 |
| KR | 20190140806 A | 12/2019 |
| WO | 2020020763 A1 | 1/2020 |

VEHICLE AND A DISPLAY DEVICE FOR USE THEREIN

BACKGROUND

The discussion below is merely provided for general background information and is not intended to be used as an aid in determining the scope of the claimed subject matter.

Aspects of the invention relates to a display device for a vehicle.

Display devices in vehicles are known from the prior art for instance in which display devices are attached to the interior side of the roof of a vehicle and which displays can be pivoted from a storage position into an operational position in which the display screen is readable to the occupants of the vehicle. However, a simplified operating mechanism is desired.

SUMMARY

This Summary and the Abstract herein are provided to introduce a selection of concepts in a simplified form that are further described below in the Detailed Description. This Summary and the Abstract are not intended to identify key features or essential features of the claimed subject matter, nor are they intended to be used as an aid in determining the scope of the claimed subject matter. The claimed subject matter is not limited to implementations that solve any or all disadvantages noted in the Background.

A display device for attachment to a roof of a vehicle, comprises a display screen capable of showing images to occupants in the vehicle and an operating mechanism mounted to the roof construction for moving the display screen at least into a storage position and into an operational position in which the display screen is visible for occupants in an interior space of the vehicle. The operating mechanism includes at least one guide rail to be mounted to the roof of the vehicle and a first and second slide shoe slidably guided in the guide rail one after the other. A screen support supports the display screen. The screen support is pivotally connected to one of the first and second slide shoes. A lever is pivotally connected to the screen support and to the other of the first and second slide shoes to at least rotate the display screen between its operational position and storage position by changing the distance between the first and second slide shoes. Only the first slide shoe is driven by a drive motor. The second slide shoe is provided with a locking mechanism, configured to lock the second slide shoe at a position where the display screen is moved toward its operational position.

In an advantageous embodiment, this display device only requires one drive motor which saves considerable cost.

In one embodiment, the lever is pivotally connected to the second slide shoe and preferably the screen support is connected such to the first and second slide shoes that, when moving between the operative position and the storage position, it is rotated and simultaneously slid at its upper end in a direction substantially parallel to the guide rail.

The screen support may be pivotally connected at its upper end to one of the first and second slide shoes. The top of the display screen will then stay close to the roof when moving to the operational position.

The lever may be pivotally connected to the screen support a distance from the upper end of the screen support. This distance will determine the transmission ratio between relative movement of the slide shoes and the angle of rotation of the screen support.

The locking mechanism includes a locking element, preferably continuously, connected to the second slide shoe and to the first slide shoe, such that in a first position of the locking element, the first and second slide shoe are locked with respect to each other and in a second position of the locking element, the first slide shoe is free to move with respect to the second slide shoe. The locking element is preferably connected both to the guide rail and to the second slide shoe with a forcing guide configured to move the locking element in both directions between the first position and the second position.

Due to this forcing guide acting in both directions, there is no need for a spring to lock and an additional slide shoe to unlock the second slide shoe.

The second slide shoe is preferably locked with respect to guide rail by the locking element in the second position of the locking element.

In a preferred embodiment, the locking element is a locking lever which is pivotally connected to the second slide shoe at a first end and is slidably in engagement with the first slide shoe, the locking lever being movably in engagement with the guide rail at its second end so as to rotate the locking lever between its first and second position.

Such locking lever is a reliable locking element as a rotational movement is more reliable and wear resistant than a sliding/translational movement.

In a further development, the locking lever is provided with a pin on its second end which is in engagement with a curve in the guide rail, said curve including a first portion parallel to the longitudinal direction of the guide rail and a second portion angled with respect to the first portion, the first slide shoe being provided with a pin which is slidably in engagement with a guide curve in the locking lever, the guide curve of the locking lever including a first portion extending parallel to the longitudinal direction of the guide rail in its second position and including a second portion angled with respect the first portion of the guide curve, such that when the locking lever is in its second position the pin of the locking lever is in the second portion of the curve in the guide rail and the pin of the first slide shoe is in engagement with the first portion of the guide curve in the locking lever, and that when the locking lever is in its first position the pin of the locking lever is in the first portion of the curve in the guide rail and the pin of the first slide shoe is in engagement with the second portion of the guide curve in the locking lever.

The curve of the guide rail may be formed in a locator mounted to the guide rail. This is much easier than working the curve directly into the guide rail.

The invention also relates to a vehicle comprising the display device described above.

BRIEF DESCRIPTION OF THE DRAWINGS

Aspects of the invention will be further explained with reference to the drawings showing exemplary embodiments of the roof construction and vehicle.

DETAILED DESCRIPTION OF THE ILLUSTRATIVE EMBODIMENT

Figure 1:
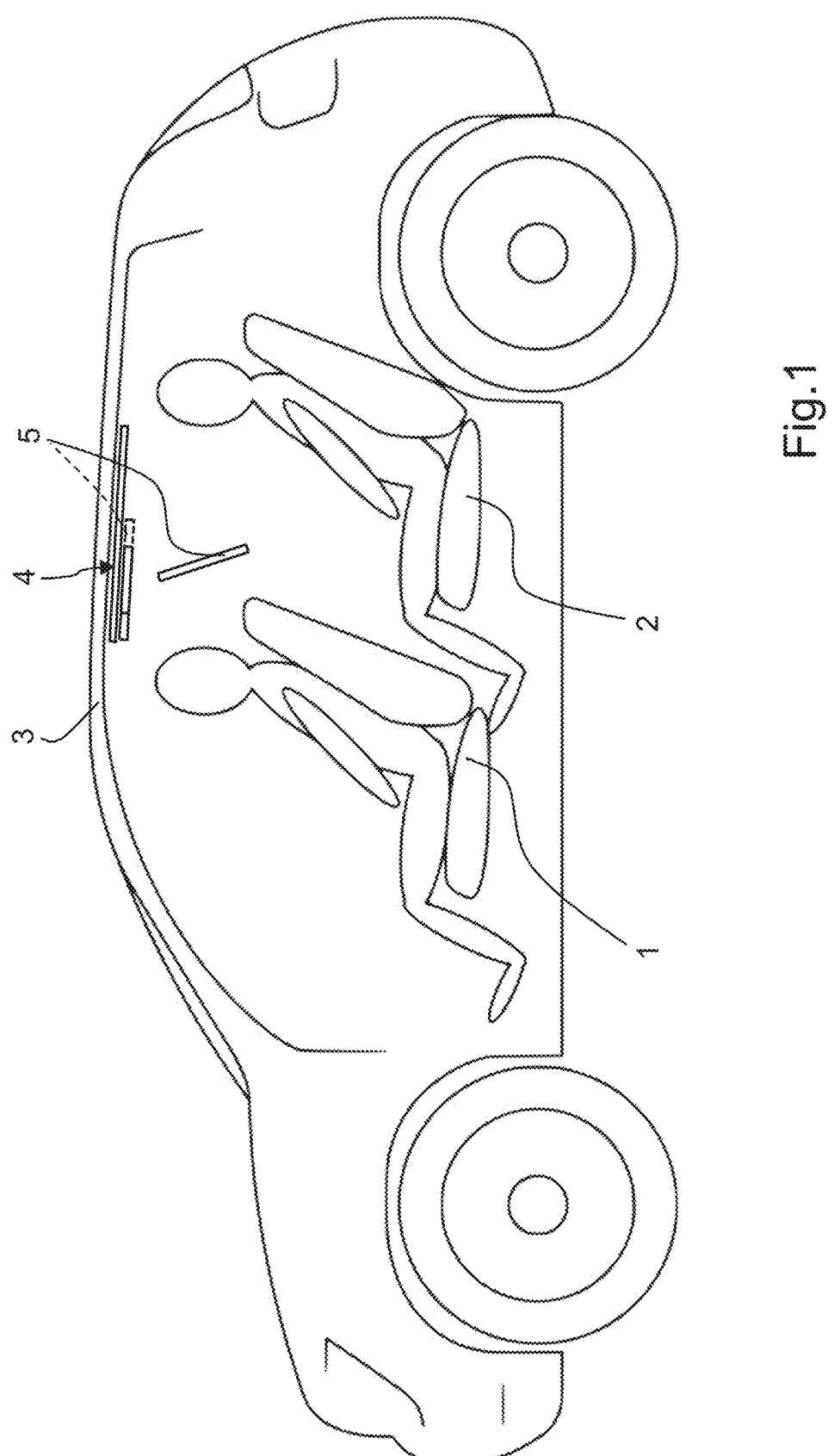
FIG. 1 is a very schematic side view, partially broken away, of a vehicle with a display device.

FIG. 1 illustrates a vehicle, in this case a passenger car, having a compartment comprising front seats 1 and rear seats 2 for vehicle occupants, and a roof 3. Further a display device 4 is illustrated comprising a display screen 5 which is shown in an operational position with solid lines and in a storage position with dash lines. The operational position of the display screen 5 is the position in which the rear occupant has the optimum line of view on the display screen 5. In FIG. 1 a display device 4 is shown for the rear occupants. It is conceivable that the display device 4 is available for one or both occupants in the front of the vehicle. In the storage position, the display screen 5 is positioned adjacent and parallel to the roof 3.

Figure 2:
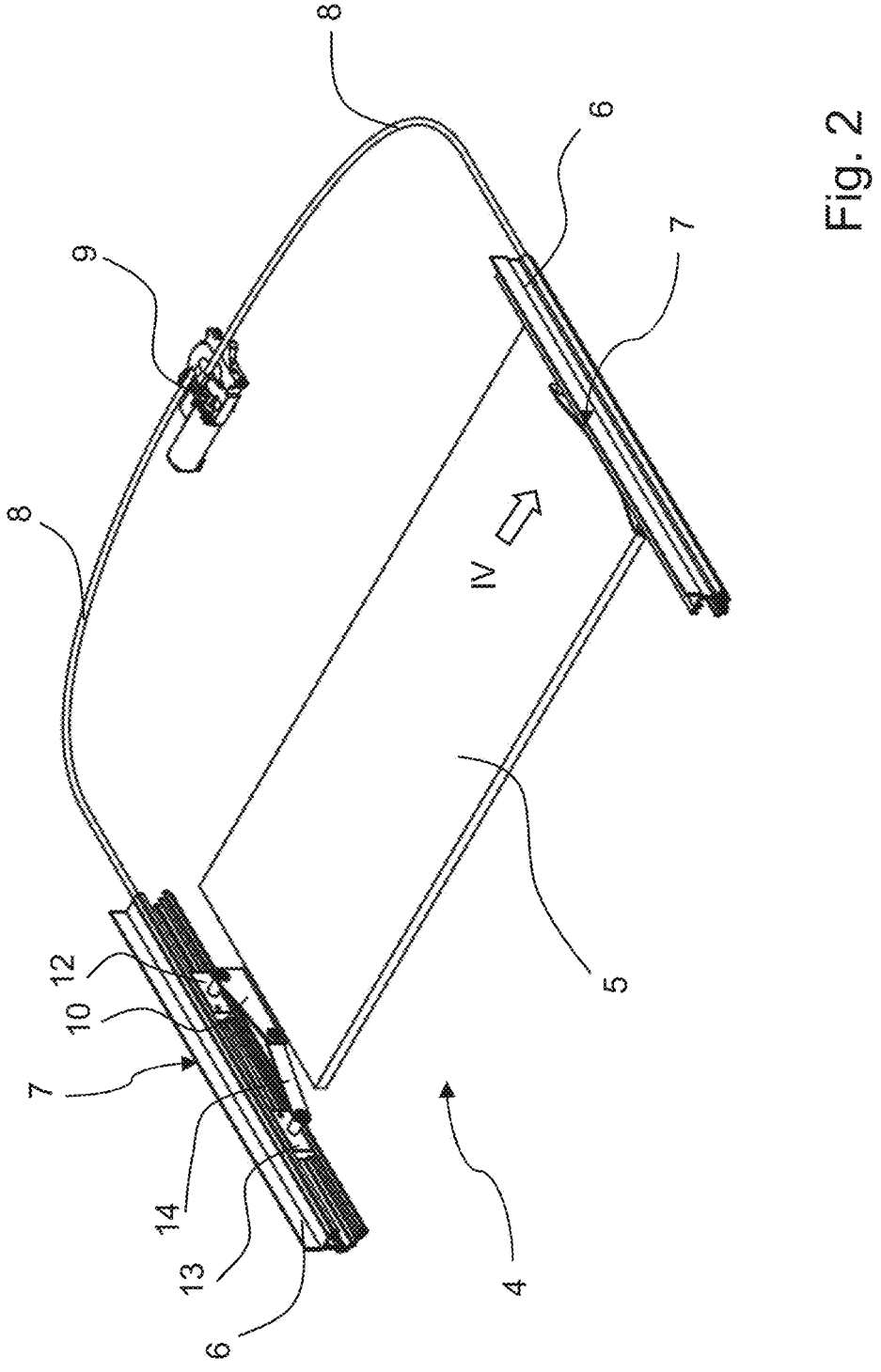
FIG. 2 is an enlarged perspective view of the display device of FIG. 1.

FIG. 2 shows a perspective view of the display device 4 showing the display screen 5, two parallel guide rails 6 on either side of the display screen 5, an operating mechanism 7 supported and guided by each guide rail 6, drive cables 8 (guided in guide tubes) and a drive motor, here an electric motor 9. The guide rails 6 may be attached directly to the vehicle, such as the side beams of the roof 3, or a separate frame could be present, for example a frame of a roof system. The electric motor 9 can be actuated to move the operating mechanisms 7 through the drive cables 8 in order to displace the display screen 5 between the storage position and the operational position. The display screen 5 may be of such dimension that it extends along almost the complete width of the vehicle compartment, but smaller dimensions are conceivable of course. It would also be possible to mount two display screens side-byside and being movable either independently (by 2 operating mechanisms) or together.

Figure 3:
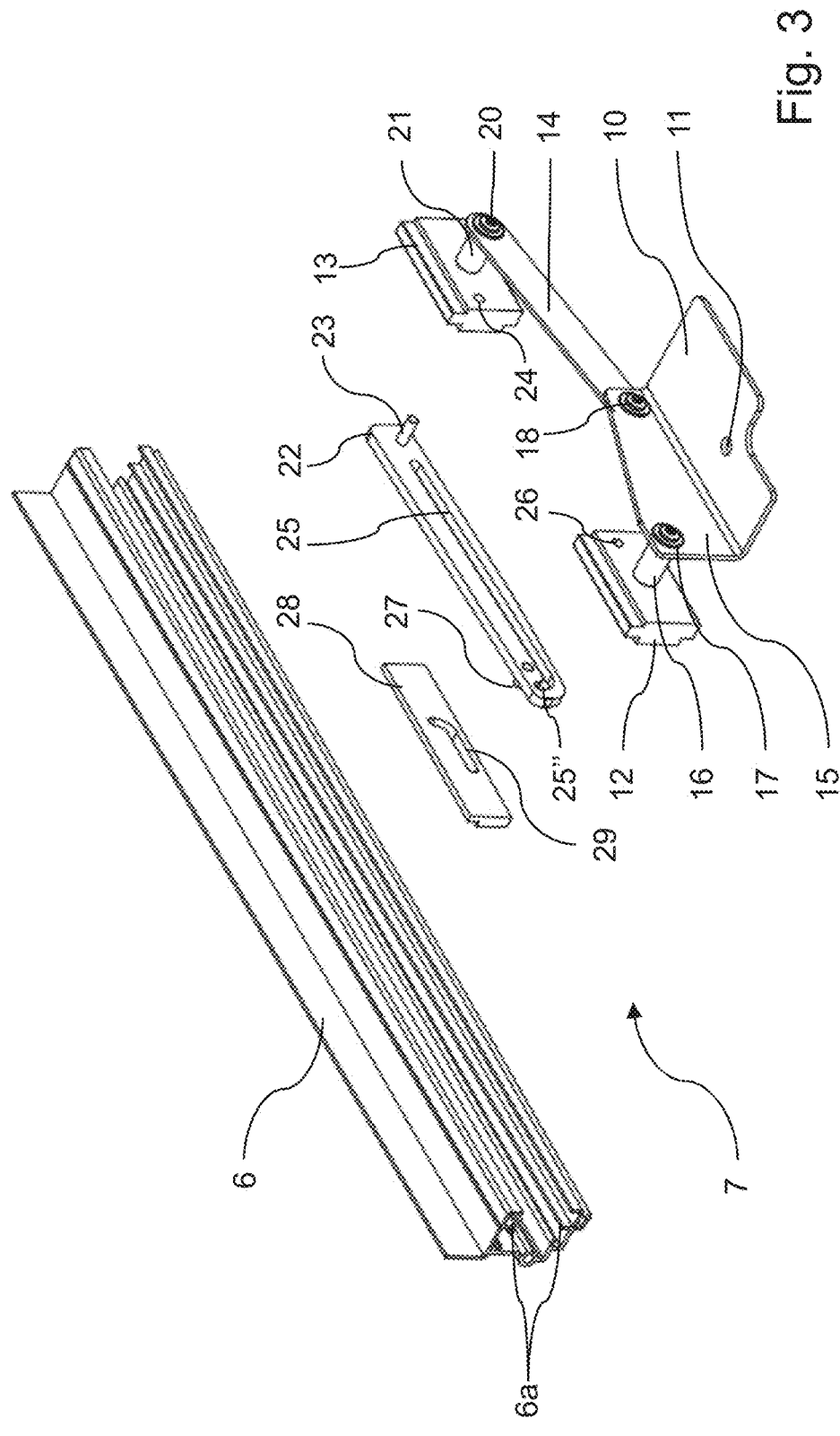
FIG. 3 is a further enlarged exploded view of a guide rail and operating mechanism of the display device of FIG. 2.

FIG. 3 is an exploded view of one of the guide rails 6 and operating mechanisms 7. The operating mechanism 7 includes a screen support 10 to which the display screen 5 can be attached, for example by means of screws or bolts inserted through one or more holes 11 in the screen support 10 and into screw thread in the display screen 5.

The screen support 10 is pivotally connected to a first slide shoe 12 and is connected to a second slide shoe 13 through a lever 14. In this case, the display support 10 has a vertical bracket 15 fixed to a pivot shaft 16 through a screw 17. The lever 14 is pivotally connected to the bracket 15 of the screen support 5 by a screw 18 and nut 19 (FIG. 4), while the lever 14 is pivotally connected to the second slide shoe 13 by a screw 20 and pivot shaft 21. The slide shoes 12 and 13 are slidably guided in a groove 6A of the guide rail 6 and the first slide shoe 12 is fixed to an end of the respective drive cable 8 (not shown). The slide shoes 12 and '13 are positioned one after the other within the guide rail 6.

Figures 5A, 5B:
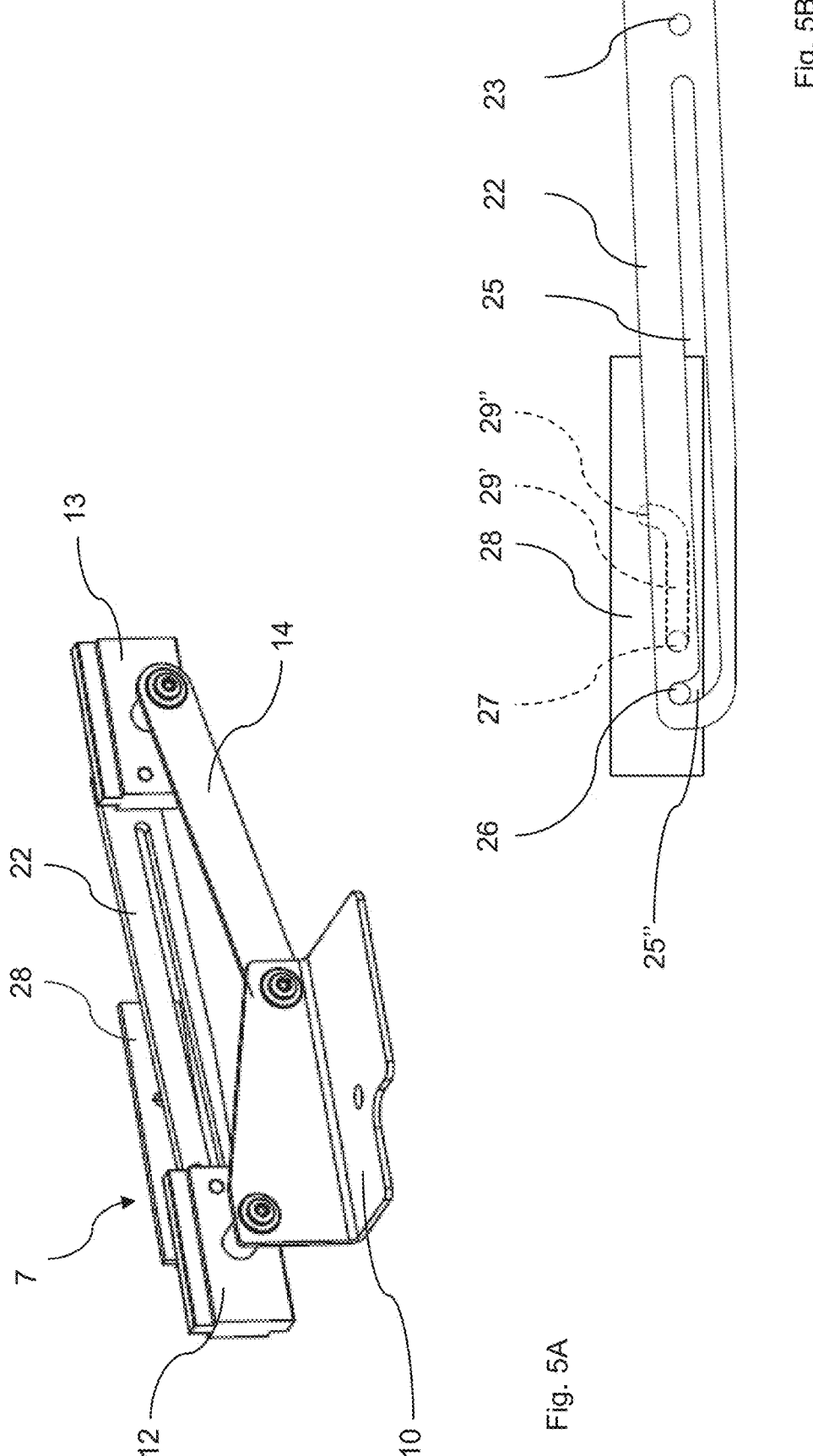
FIGS. 5A, 6A and 7A are perspective views of the operating mechanism of FIG. 3 in 3 different positions.
FIGS. 5B, 6B and 7B are side views of the locking mechanism of the operating mechanism of FIGS. 5A, 6A and 7A in the same positions.

FIG. 3 also shows a locking lever 22 which is pivotally connected to the second slide shoe 13 through a pivot pin 23 inserted in a hole 24 in the second slide shoe 13. The locking lever 22 comprises a curve 25 including a slide portion 25' substantially parallel to the guide rail 6 and a locking portion 25" angled to the slide portion 25' (FIG. 5B). A pin 26 on the first slide shoe 12 (only a hole for the pin 26 is shown in FIG. 3) engages the curve 25. The locking lever 22 is provided with a pin 27 near its end remote from the pivot pin 23 and therefore close to the locking portion 25" of the curve 25.

A locator 28 is fixed to the guide rail 6 and comprises a curve 29 comprising a sliding portion 29' extending parallel to the guide rail 6 and a locking portion 29" angled to the longitudinal extent of the guide rail 6 (FIG. 5B). The locator 28 is positioned in and fixed to the guide rail 6 in a position deeper into the guide rail 6 than the groove 6a so that the slide shoes 12 and 13, and the locking lever 22 do not interfere with the locator 28. One end of the locking lever 22 is positioned adjacent to the locator 28 such that the pin 27 engages into the curve 29. The pins 26 and 27 and the curves 25 and 29 together form a forcing guide for the locking lever 22 configured to move the locking lever in two directions, here up and down, i.e., between two locking positions.

Figure 4:
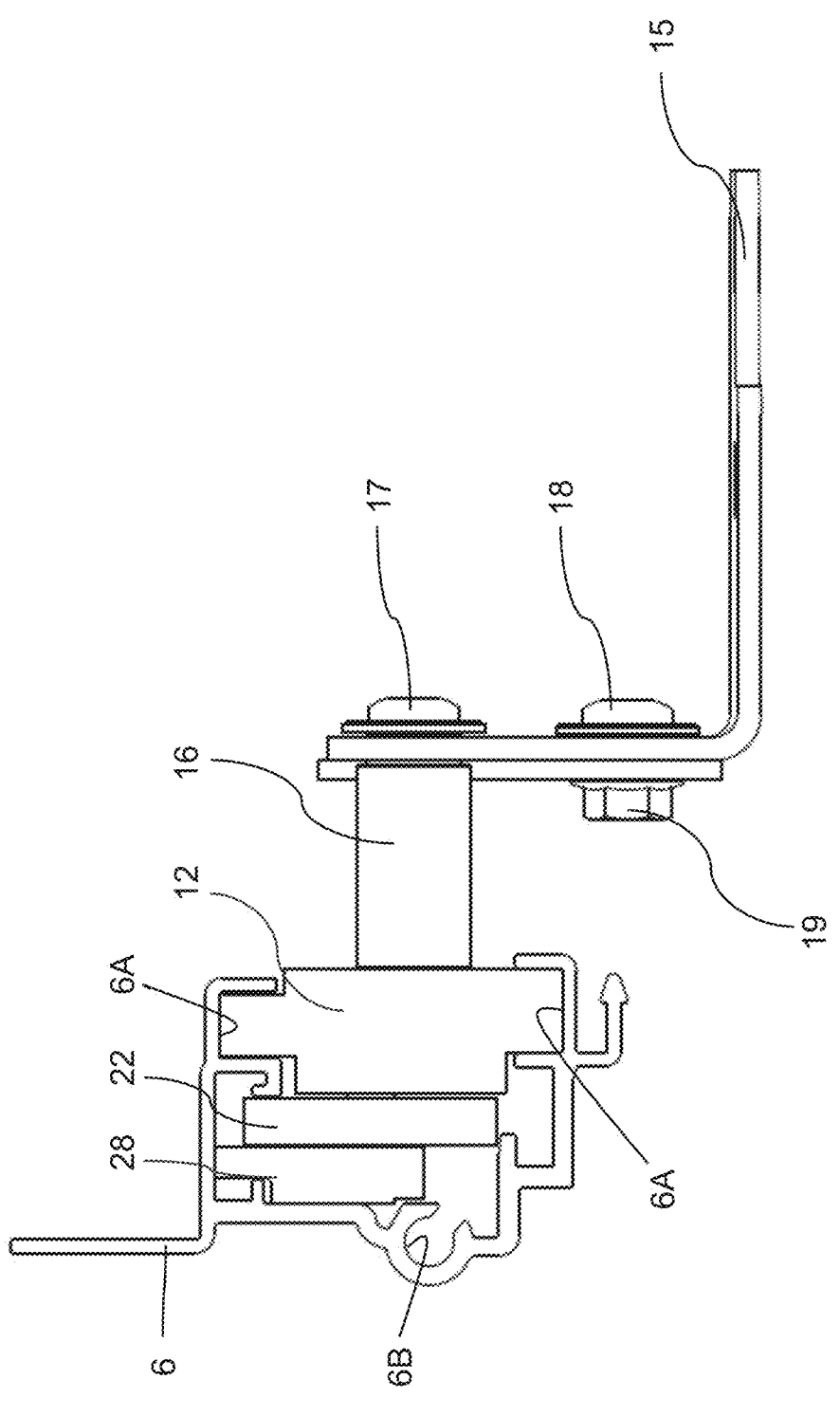
FIG. 4 is a further enlarged view in the direction of arrow IV in FIG. 2.

FIG. 4 shows how the slide shoe 12, locking lever 22 and locator 28 are positioned within the guide rail 6. The slide shoes 12, 13 are firmly held at their upper and lower sides by the groove 6A of the guide rail 6. Also shown is a cable guide 6B in the guide rail 6 through which the drive cable 8 runs. A cable attachment (not shown) will fix the cable 8 to the first slide shoe 12.

FIGS. 5-7 illustrate the operation of the operating mechanism 7 for the display screen 5.

FIGS. 5A and 5b show the position of the operating mechanism 7 when the display screen 5/display support 10 is in its storage position. The slide shoes 12 and 13 are locked to each other by the locking lever 22 because the pin 26 of the first slide shoe 12 is located in the locking portion 25" of the curve 25 in the locking lever 22. The pin 26 cannot move out of the locking portion 25" because the pin 27 of the locking lever 22 is located in the sliding portion 29' of the curve 29 in the locator 28 so that a vertical movement, i.e. a rotation of the locking lever 22 around pivot pin 23 is prevented thereby. Thus, if in this position, the first slide shoe 12 is driven by the cable 8 to the right in FIGS. 5a and 5B, both slide shoes 12, 13 will be moved in common, and thus the display screen 10 will be moved parallel to the guide rail 6.

Figures 6A, 6B:
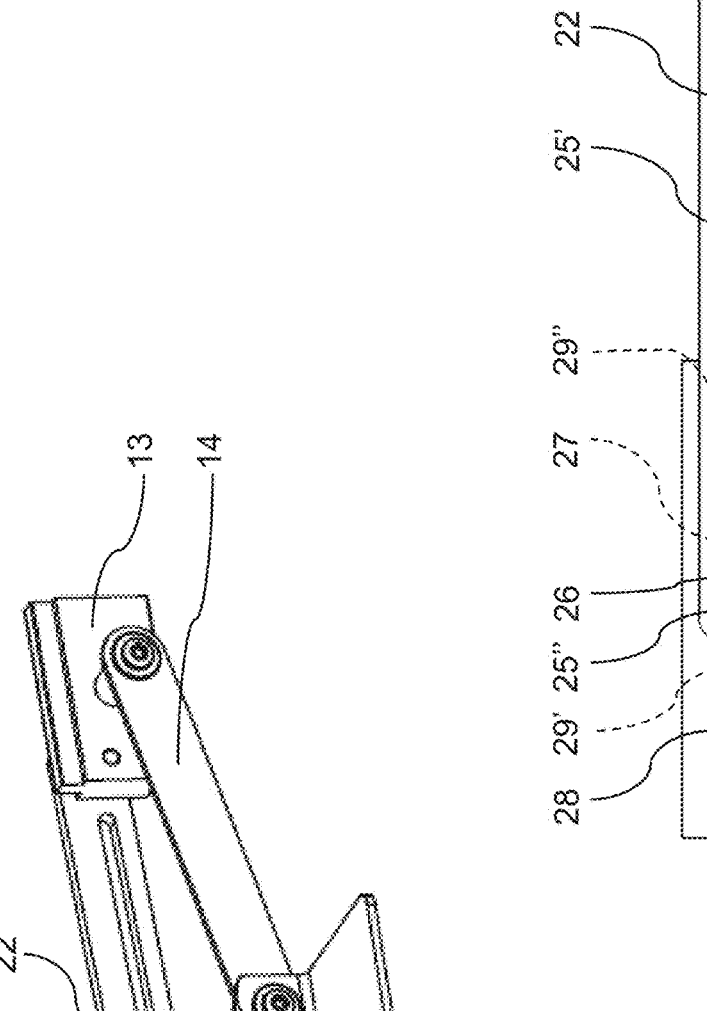

In FIGS. 6A and 6B, the pin 27 of the lever 22 has arrived at the locking portion 29" of the curve 29 and the pin 27 is forced to move in upward direction along the locking portion 29", thereby rotating the lever 22 in FIG. 6 in an anti-clockwise direction, whereby the locking portion 25" of the curve 25 moving upwards with respect to the pin 26. In this manner, the pin 26 arrives in the sliding portion 25' of the curve 25 as is shown in FIG. 6B. The pin 26 is now free to move through the sliding portion 25' of the curve 25 in the lever 22, which now extends parallel to the groove 6A in the guide rail 6. The lever 22 is locked with respect to the guide rail 6 because the pin 27 of the lever 22 is locked in the upper end of the locking portion 29" in the curve 29 of the locator 28 in the guide rail 6 due to the pin 26 being present in the horizontally oriented sliding portion 25' of the curve 25 in the locking lever 22.

Figures 7A, 7B:
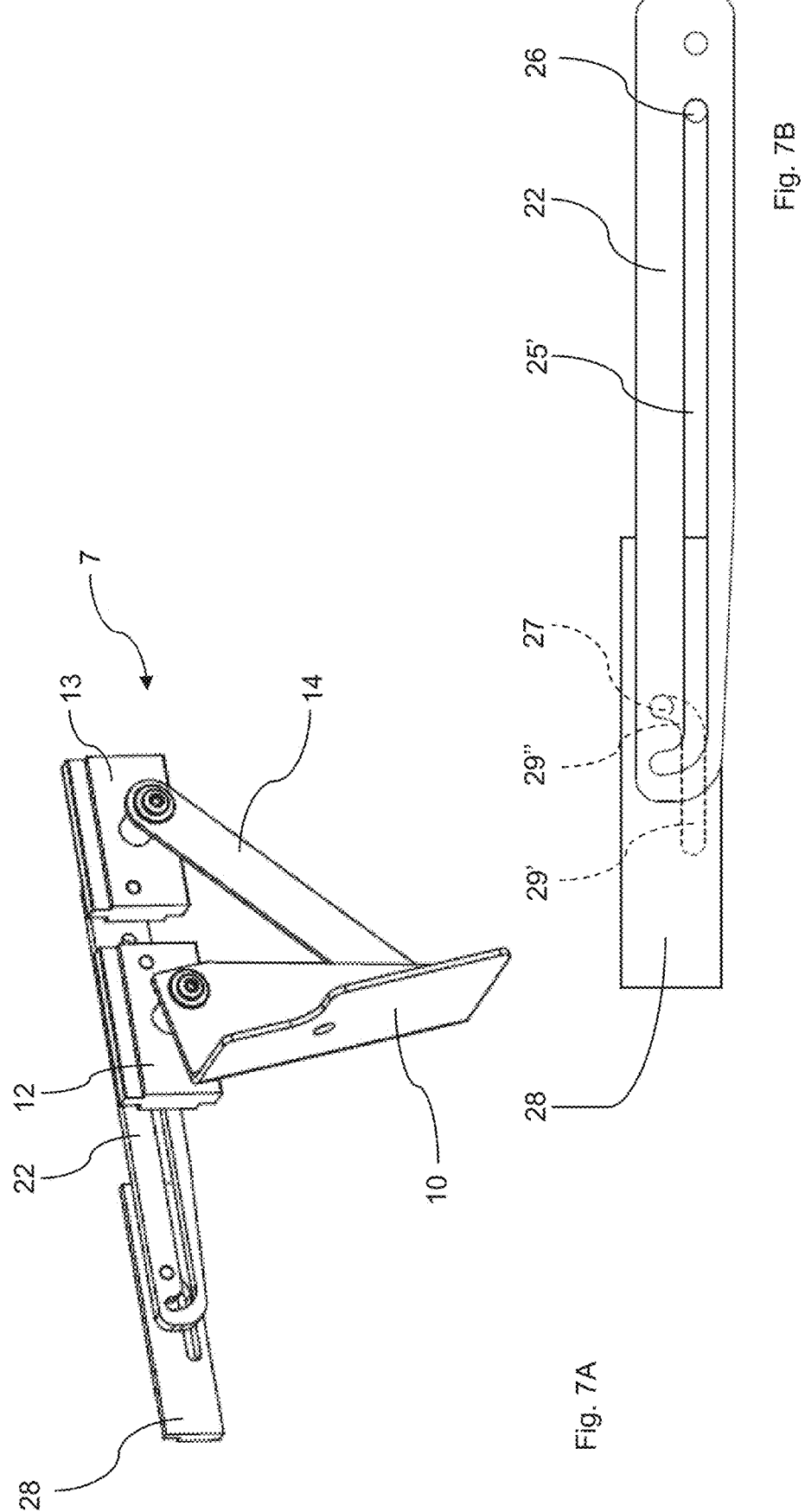

FIGS. 7A and 7B show the operating mechanism 7 in a position in which the display screen 5 on the screen support 10 is in its operational position, i.e., directed vertically or almost vertically. It is clear from a comparison of FIGS. 6 and 7 that the first slide shoe 12 is moved toward the second slide shoe 13 which is locked to the guide rail 6 due to the lever 22 being locked to the locator 28. In FIG. 7B, the pin 26 of the first slide shoe 12 has arrived at the end of the sliding portion 25' of the curve 25 in the lever 22. No further movement is possible. During the travel of the first slide shoe 12 with respect to the second slide shoe 13, the upper side of the screen support 10 and of the display screen 5 has been slid, while the screen support 10 and display screen 5 have also been rotated due to the downward rotation of the lever 14 which resulted from the relative movements of the first and second slide shoes 12, 13 decreasing the length of the base of the triangle formed by the lever 14, the screen support 10 and the slide shoes 12, 13. This deformable triangle leads to the desired movements of the display screen 5.

An actuation of the electric motor 9 in the reverse direction results in an opposite movement of the screen support 10 and display screen 5 toward the storage position again.

The invention is not limited to the example described above and shown in the drawings and may be varied in different other ways. For instance, the electric motor 9 is drawn at the right side in FIG. 2 but could also be positioned on the other side. It would also be possible to drive the second slide shoe 13 and lock and unlock the first slide shoe. The display screen 5 then make a pure rotational movement when moving between the position parallel to the guide rails 6 and the vertical or inclined operational position. The locking lever or other locking element could not only move in vertical direction with respect to the guide rail, but also in lateral direction. The curve 25 of the locking lever 22 could also be formed in the second slide shoe 13 engaged by a pin of the locking lever 22. The curve 29 of the locator 29 in the guide rail 6 will then be in the locking lever 22 engaged by a pin 27 in the guide rail 6 or locator 28. The length of the locator 28 and the sliding portion 29' of its curve 29 may be varied depending on the desired length of the horizontal movement of the display screen 5 before it is rotated to its operational position. The first and second slide shoes 12, 13 are here guided in the same groove 6A of the guide rail, but it is conceivable that they are guided in different grooves of the guide rail 6. The display devices 7 can be of any type available on the market. Normally, the display screen 5 will be faced up in its storage position, but it is of course also conceivable that a two-sided screen is used which is for example useful if the front seats are rotatable, such as in a mobile home or autonomous vehicle.

What is claimed is:

1. A display device for attachment to a roof of a vehicle, comprising:

a display screen capable of showing images to occupants in the vehicle, and an operating mechanism configured to move the display screen at least into a storage position and into an operational position in which the display screen is visible for occupants in an interior space of the vehicle, the operating mechanism including:

a guide rail to be mounted to the roof of the vehicle, a first and second slide shoe slidably guided in the guide rail one after the other, a screen support configured to support the display screen, said screen support being pivotally connected to one of the first and second slide shoes, and a lever pivotally connected to the screen support and to the other of the first and second slide shoes to move the display screen between the operational position and the storage position by changing a distance between the first and second slide shoes, a drive motor connected to drive only the first slide shoe, and wherein the second slide shoe is provided with a locking mechanism configured to lock the second slide shoe at a position to the guide rail where the display screen is moved toward the operational position.

2. The display device according to claim 1, wherein the lever is pivotally connected to the second slide shoe.

3. The display device according to claim 2, wherein the screen support is connected such to the first and second slide shoes that, when moving between the operative position and the storage position, the screen support is rotated and simultaneously slid at an upper end thereof in a direction parallel to the guide rail.

4. The display device according to claim 1, wherein the screen support is pivotally connected at an upper end thereof to one of the first and second slide shoes.

5. The display device according to claim 4, wherein the lever is pivotally connected to the screen support a distance from the upper end of the screen support.

6. The display device according to claim 1, wherein the locking mechanism includes a locking element continuously connected to the second slide shoe and to the first slide shoe, such that in a first position of the locking element, the first and second slide shoe are locked with respect to each other and in a second position of the locking element, the first slide shoe is free to move with respect to the second slide shoe, the locking element being connected both to the guide rail and to the second slide shoe with a forcing guide configured to move the locking element in both directions between the first position and the second position.

7. The display device according to claim 6, wherein the second slide shoe is locked with respect to the guide rail by the locking element in the second position of the locking element.

8. The display device according to claim 7, wherein the locking element is a locking lever which is pivotally connected to the second slide shoe at a first end and is slidably in engagement with the first slide shoe, the locking lever being movably in engagement with the guide rail at a second end so as to rotate the locking lever between the first and second position.

9. The display device according to claim 8, wherein the forcing guides include a pin on the second end of the locking lever which is in engagement with a curve in the guide rail, said curve including a first portion parallel to a longitudinal direction of the guide rail and a second portion angled with respect to the first portion, and include a pin on the first guide shoe which is slidably in engagement with a guide curve in the locking lever, the guide curve of the locking lever including a first portion extending parallel to the longitudinal direction of the guide rail in the second position and including a second portion angled with respect the first portion of the guide curve, such that when the locking lever is in the second position the pin of the locking lever is in the second portion of the curve in the guide rail and the pin of the first slide shoe is in engagement with the first portion of the guide curve in the locking lever, and that when the locking lever is in the first position the pin of the locking lever is in the first portion of the curve in the guide rail and the pin of the first slide shoe is in engagement with the second portion of the guide curve in the locking lever.

10. The display device according to claim 9, wherein the curve of the guide rail is formed in a locator mounted to the guide rail.

11. The display device of claim 1, wherein the operating mechanism at least rotates the display screen between the operational position and the storage position.

12. A vehicle, comprising:

a roof, a display screen capable of showing images to occupants in the vehicle, and an operating mechanism configured to move the display screen at least into a storage position and into an operational position in which the display screen is visible for occupants in an interior space of the vehicle, the operating mechanism including:

a guide rail mounted to the roof of the vehicle, a first and second slide shoe slidably guided in the guide rail one after the other, a screen support configured to support the display screen, said screen support being pivotally connected to one of the first and second slide shoes, and a lever pivotally connected to the screen support and to the other of the first and second slide shoes to move the display screen between the operational position and the storage position by changing a distance between the first and second slide shoes, a drive motor connected to drive only the first slide shoe, and wherein the second slide shoe is provided with a locking mechanism configured to lock the second slide shoe at a position to the guide rail where the display screen is moved toward the operational position.

13. The vehicle according to claim 12, wherein the lever is pivotally connected to the second slide shoe.

14. The vehicle according to claim 13, wherein the screen support is connected such to the first and second slide shoes that, when moving between the operative position and the storage position, the screen support is rotated and simultaneously slid at an upper end thereof in a direction parallel to the guide rail.

15. The vehicle according to claim 12, wherein the screen support is pivotally connected at an upper end thereof to one of the first and second slide shoes.

16. The vehicle according to claim 15, wherein the lever is pivotally connected to the screen support a distance from the upper end of the screen support.

17. The vehicle according to claim 12, wherein the locking mechanism includes a locking element continuously connected to the second slide shoe and to the first slide shoe, such that in a first position of the locking element, the first and second slide shoe are locked with respect to each other and in a second position of the locking element, the first slide shoe is free to move with respect to the second slide shoe, the locking element being connected both to the guide rail and to the second slide shoe with a forcing guide configured to move the locking element in both directions between the first position and the second position.

18. The vehicle according to claim 17, wherein the second slide shoe is locked with respect to the guide rail by the locking element in the second position of the locking element.

19. The vehicle according to claim 18, wherein the locking element is a locking lever which is pivotally connected to the second slide shoe at a first end and is slidably in engagement with the first slide shoe, the locking lever being movably in engagement with the guide rail at a second end so as to rotate the locking lever between the first and second position.

20. The vehicle according to claim 19, wherein the forcing guides include a pin on the second end of the locking lever which is in engagement with a curve in the guide rail, said curve including a first portion parallel to a longitudinal direction of the guide rail and a second portion angled with respect to the first portion, and include a pin on the first guide shoe which is slidably in engagement with a guide curve in the locking lever, the guide curve of the locking lever including a first portion extending parallel to the longitudinal direction of the guide rail in the second position and including a second portion angled with respect the first portion of the guide curve, such that when the locking lever is in the second position the pin of the locking lever is in the second portion of the curve in the guide rail and the pin of the first slide shoe is in engagement with the first portion of the guide curve in the locking lever, and that when the locking lever is in the first position the pin of the locking lever is in the first portion of the curve in the guide rail and the pin of the first slide shoe is in engagement with the second portion of the guide curve in the locking lever.

* * * * *